United States Patent [19]
Kawauchi et al.

[11] Patent Number: 5,784,012
[45] Date of Patent: Jul. 21, 1998

[54] VARIABLE-LENGTH CODE DECODER

[75] Inventors: Kenichi Kawauchi; Taro Yokose; Yutaka Koshi; Eiri Hashimoto, all of Nakai-machi, Japan

[73] Assignee: Fuji Xerox Co., Ltd., Tokyo, Japan

[21] Appl. No.: 717,945

[22] Filed: Sep. 23, 1996

[30]  Foreign Application Priority Data

Apr. 9, 1996  [JP]  Japan .................... 8-086728

[51]  Int. Cl.⁶ ............................................. H03M 7/40
[52]  U.S. Cl. ............................. 341/67; 341/63; 341/65; 341/106
[58]  Field of Search ................... 341/65, 67, 106, 341/63

[56]  References Cited

U.S. PATENT DOCUMENTS

| | | | |
|---|---|---|---|
| 5,254,991 | 10/1993 | Ruetz et al. | 341/65 |
| 5,280,349 | 1/1994 | Wang et al. | 358/133 |
| 5,528,628 | 6/1996 | Park et al. | 375/240 |
| 5,568,139 | 10/1996 | Yoon | 341/67 |
| 5,600,812 | 2/1997 | Park | 395/410 |
| 5,617,089 | 4/1997 | Kinouchi et al. | 341/65 |
| 5,652,582 | 7/1997 | Truong et al. | 341/65 |

FOREIGN PATENT DOCUMENTS

A-7-212242  8/1995  Japan.

*Primary Examiner*—Jeffrey A. Gaffin
*Assistant Examiner*—Jason L. W. Kost
*Attorney, Agent, or Firm*—Oliff & Berridge, PLC

[57] ABSTRACT

A variable-length code decoder includes plural barrel shifters, each of which executes shift processing on inputted variable-length code data bit by bit from the 0 bit to (the bit number of a maximum length codeword −1). The barrel shifters, which are in number equal to the bit number of the maximum length codeword, are arranged in parallel connection. Plural storing devices are provided, each of which stores a pair of a decoded symbol and codeword length thereof corresponding to code data. Plural fetching devices are provided, each of which fetches the pair of the decoded symbol and the codeword length thereof in accordance with the code data outputted from each of the barrel shifters. Each of the fetching devices is connected to a respective barrel shifter and storing devices. A selecting device is provided for selecting a predetermined pair from plural pairs of the decoded symbol and the codeword length fetched by the plural fetching devices in an initial decoding process. The selecting device further selects any one pair from the plural pairs of the decoded symbol and the codeword length utilizing the codeword length selected in the initial decoding process in subsequent decoding processes.

7 Claims, 17 Drawing Sheets

| SYMBOL | VARIBLE-LENGTH CODE |
|---|---|
| a1 | 00 |
| a2 | 010 |
| a3 | 011 |
| a4 | 10 |
| a5 | 1100 |
| a6 | 1101 |
| a7 | 1111 |

VARIABLE-LENGTH CODE DECODER

BACKGROUND OF THE INVENTION

1. Field of the Invention

The present invention relates to a variable-length code decoder and in particular relates to a variable-length code decoder which decodes the variable-length code data consisting of variable-length codewords.

2. Discussion of the Related Art

Generally, in the case of realizing the compression coding by coding a time series signal having uneven frequency of occurrence, a variable-length code which assigns a shorter code to the signal of higher frequency of occurrence and longer code to the signal of lower frequency of occurrence is used. Such coding is called entropy coding. As the entropy code, the Huffman code is widely applied to coding of the voice signal, image signal, and so forth.

FIG. 16 shows a variable-length code table in entropy coding. The variable-length codes are assigned to symbols a1 to a7 in accordance with the frequencies of occurrence.

FIG. 17 shows the status transition by the Huffman tree. Black dots S1 to S6 represent the initial state S1 and intermediate statuses S2 to S6 of the decoding procedure, which are (the number of symbols −1) in number. To start decoding, the process starts at S1. If the first code in decoding is 0, the process traverses the branch of 0 to transit to the status S2. If the first code is 1, the process traverses the branch of 1 to transit to the status S4. Such transition is repeated per every code, and as a result, the process reaches the symbols a1 to a7, thereby decoding is completed.

As described above, the status transition by the Huffman tree provides the procedure of advancing decoding by traversing the codes bit by bit from the top of the tree. Accordingly, in the method of decoding by traversing the Huffman tree bit by bit, only one bit can be processed in every one cycle. To carry out high-speed decoding process, methods of processing variable-length codes at once while decoding the code and the code length in parallel have been considered. One of the methods has been proposed by a variable-length code decoder disclosed by Japanese Patent Application Laid-Open No. Hei. 7-212242 (1995), which carries out decoding of two or more codewords in one decoding cycle.

FIG. 18 is a block diagram showing the construction of the above-described variable-length code decoder. An input buffer 20 consists of two latches 21 and 22, which stores compression data 1b. The bit number of each of the latches 21 and 22 is equal to the maximum length codeword (for example, p bits). The barrel shifter 30 has the bit number as twice as that of the maximum length codeword (for example, 2p bits). The data in the input buffer 20 is shifted by the barrel shifter 30 in accordance with a codeword length signal 51 outputted from the length control PLA 50.

The decode PLA 40 decodes the p bits outputted from the barrel shifter 30 and outputs a decoded symbol 41. As same as the decode PLA 40, the length control PLA 50 decodes p bits outputted from the barrel shifter 30, and determines and outputs the length of the codeword to be decoded. Here, if two or more specific short codes are continuously inputted, the decode PLA 40 carries out decoding processes on them simultaneously in one cycle.

However, in the conventional art such as described above, a loop is formed by the length control PLA 50 and the barrel shifter 30; therefore, the high-speed decoding cannot be carried out if the operation frequency is increased (for example, 70 MHz or more). That is, if the operation frequency is increased, each of processings of the length control PLA 50 and the barrel shifter 30 requires one cycle, and as a result, the process of the loop requires two cycles though both of the processings of the length control PLA 50 and the barrel shifter 30 were executed in one cycle. Therefore, if the operation frequency increases, only one codeword can be decoded in two cycles, and thereby the performance is deteriorated.

SUMMARY OF THE INVENTION

The present invention has been made in view of the above circumstances and has an object to provide a variable-length code decoder capable of decoding one or more codewords in every one cycle though the operation frequency is high.

Another object of the present invention is to provide a variable-length code decoder which requires a small amount of hardware as a whole.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims. To achieve the objects and in accordance with the purpose of the invention, as embodied and broadly described herein, a variable-length code decoder which decodes variable-length code data consisting of variable-length codewords, according to the present invention, comprises plural barrel shifters each of which executes shift processing on inputted variable-length code data bit by bit from 0 bit to (the bit number of a maximum length codeword −1), the barrel shifters being in number equal to the bit number of the maximum length codeword and arranged in parallel connection, plural storing means being in number equal to that of the barrel shifters, each of which stores a pair of a decoded symbol and codeword length thereof corresponding to code data, fetching means being in number equal to that of the barrel shifters, each of which fetches the pair of the decoded symbol and the codeword length thereof in accordance with the code data outputted from each of the barrel shifters, each of the fetching means being connect ed to each of the barrel shifters and further connected to each of the storing means, and selecting means for selecting a predetermined pair from plural pairs of the decoded symbol and the codeword length thereof fetched by the plural fetching means in an initial decoding process, and selecting any one pair from the plural pairs of the decoded symbol and the codeword length thereof fetched by the plural fetching means utilizing the codeword length selected in the initial decoding process in decoding processes subsequent thereto.

BRIEF DESCRIPTION OF THE DRAWINGS

The accompanying drawings, which are incorporated in and constitute a part of this specification illustrate embodiment of the invention and, together with the description, serve to explain the objects, advantages and principles of the invention. In the drawings.

DETAILED DESCRIPTION OF THE PREFERRED EMBODIMENT

Preferred embodiments of a variable-length code decoder according to the present invention are now described in detail based on the drawings.

First Embodiment

Figure 1:
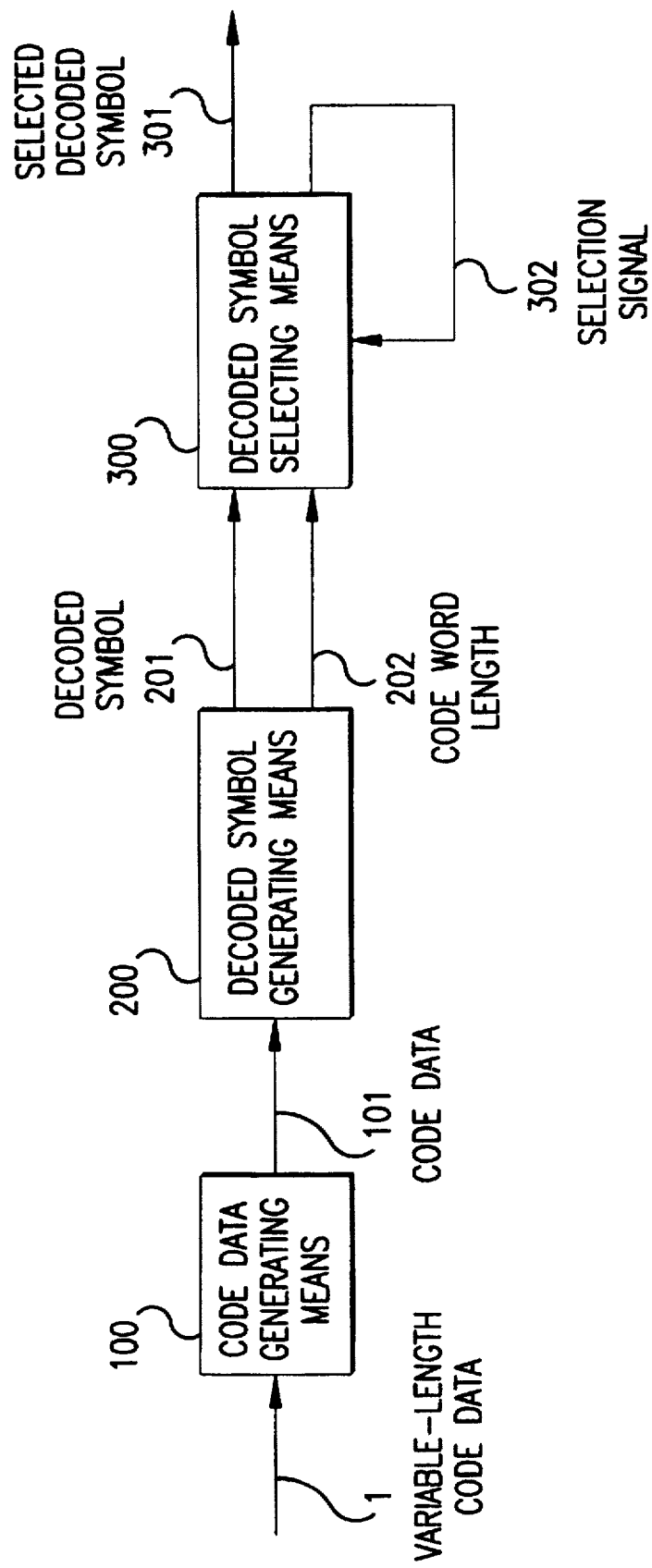
FIG. 1 shows a basic construction of a first embodiment of a variable-length code decoder according to the present invention.

FIG. 1 shows a basic construction of the variable-length code decoder. The variable-length code decoder has code data generating means 100 for outputting code data 101 having the bit number of the maximum length codeword based on the variable-length code data 1 as an input, decoded symbol generating means 200 for outputting a decoded symbol 201 and a codeword length 202, and decoded symbol selecting means 300 for outputting selected decoded symbol 301 in accordance with a selection signal 302.

On receiving the variable-length code data 1 as an input which is the coded symbol, the code data generating means 100 outputs the code data 101 having the bit number of the maximum length codeword for the bit number of the maximum length codeword.

Figures 16, 17:
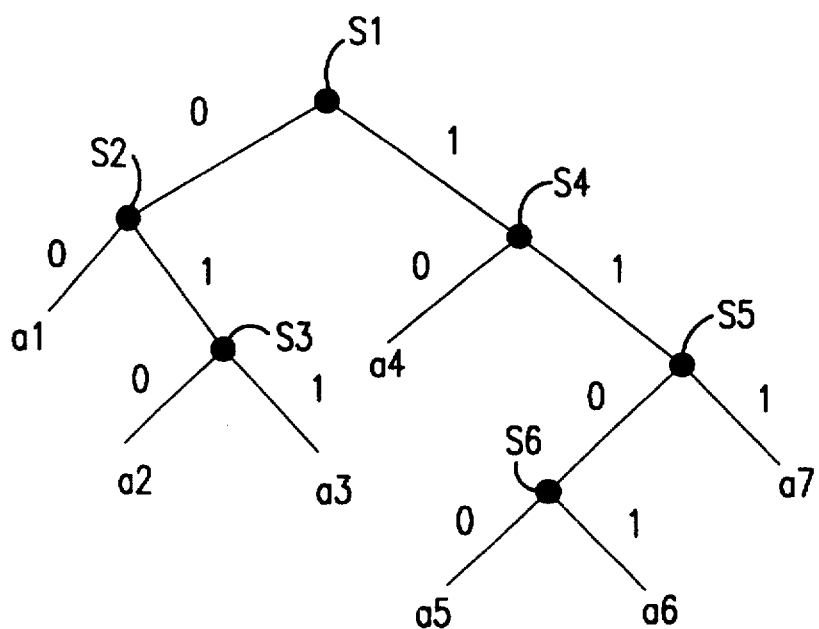
FIG. 16 shows a variable-length code table for entropy coding.
FIG. 17 shows status transition by the Huffman tree.
Figure 18:
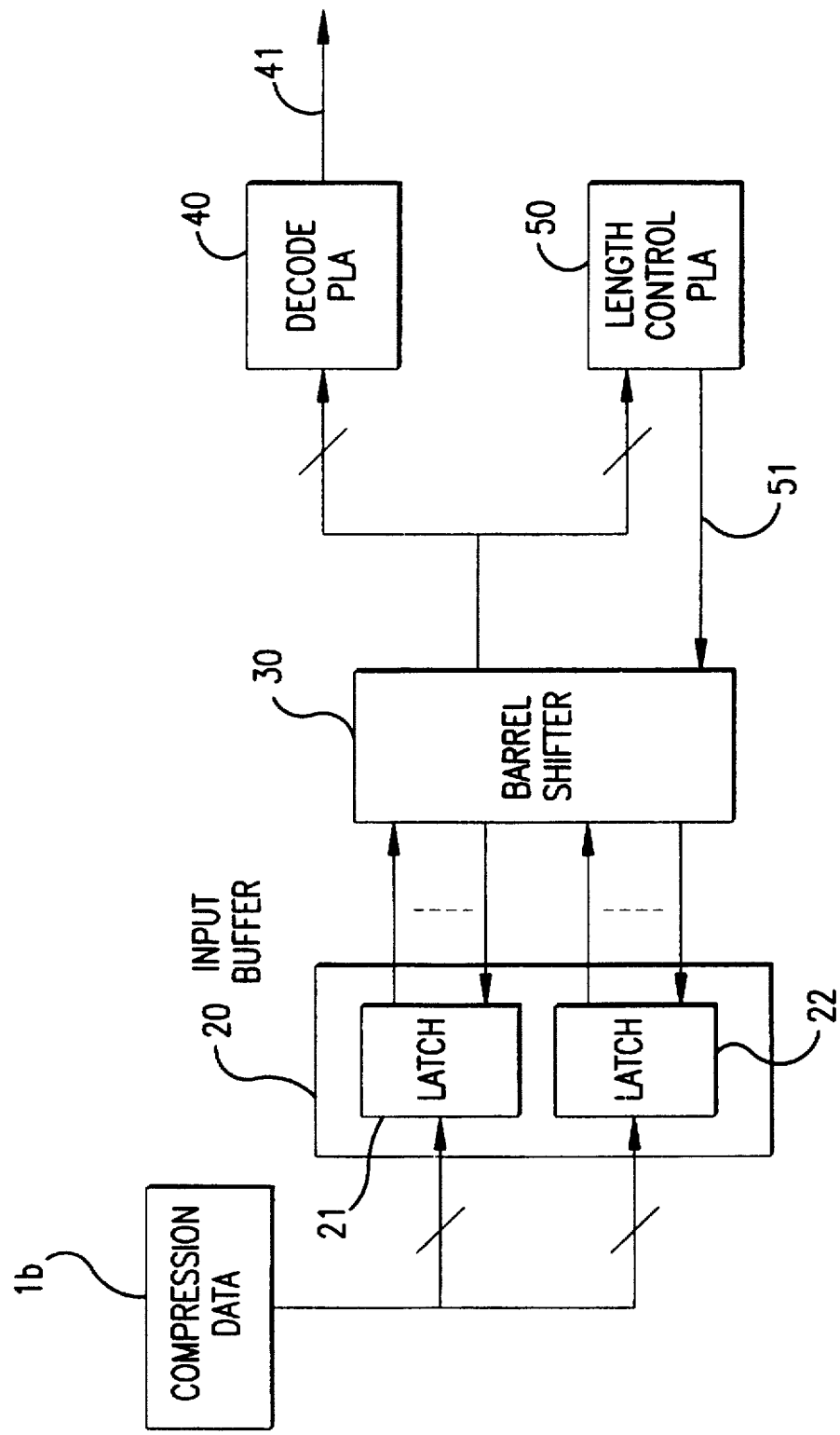
FIG. 18 is a block diagram showing a construction of a conventional variable-length code decoder.

Here, the maximum length codeword refers to the codeword having the maximum bit number among the codewords assigned to the symbols. For example, in FIG. 16, the maximum length codeword refers to 1100, 1101 and 1111 corresponding to a5, a6 and a7, respectively. Accordingly, the bit number of the maximum length codeword is 4 bits.

On receiving the code data 101 as the input, the decoded symbol generating means 200 outputs the decoded symbol 201 and the codeword length 202 corresponding to each of the code data.

The decoded symbol selecting means 300 selects a desired decoded symbol and codeword length from the decoded symbol 201 and the codeword length 202 in accordance with the selection signal 302. Then the decoded symbol selecting means 300 outputs the selected decoded symbol 301 (as the selected decoded symbol) and generates a new selection signal 302 utilizing the selected codeword length.

Figure 2:
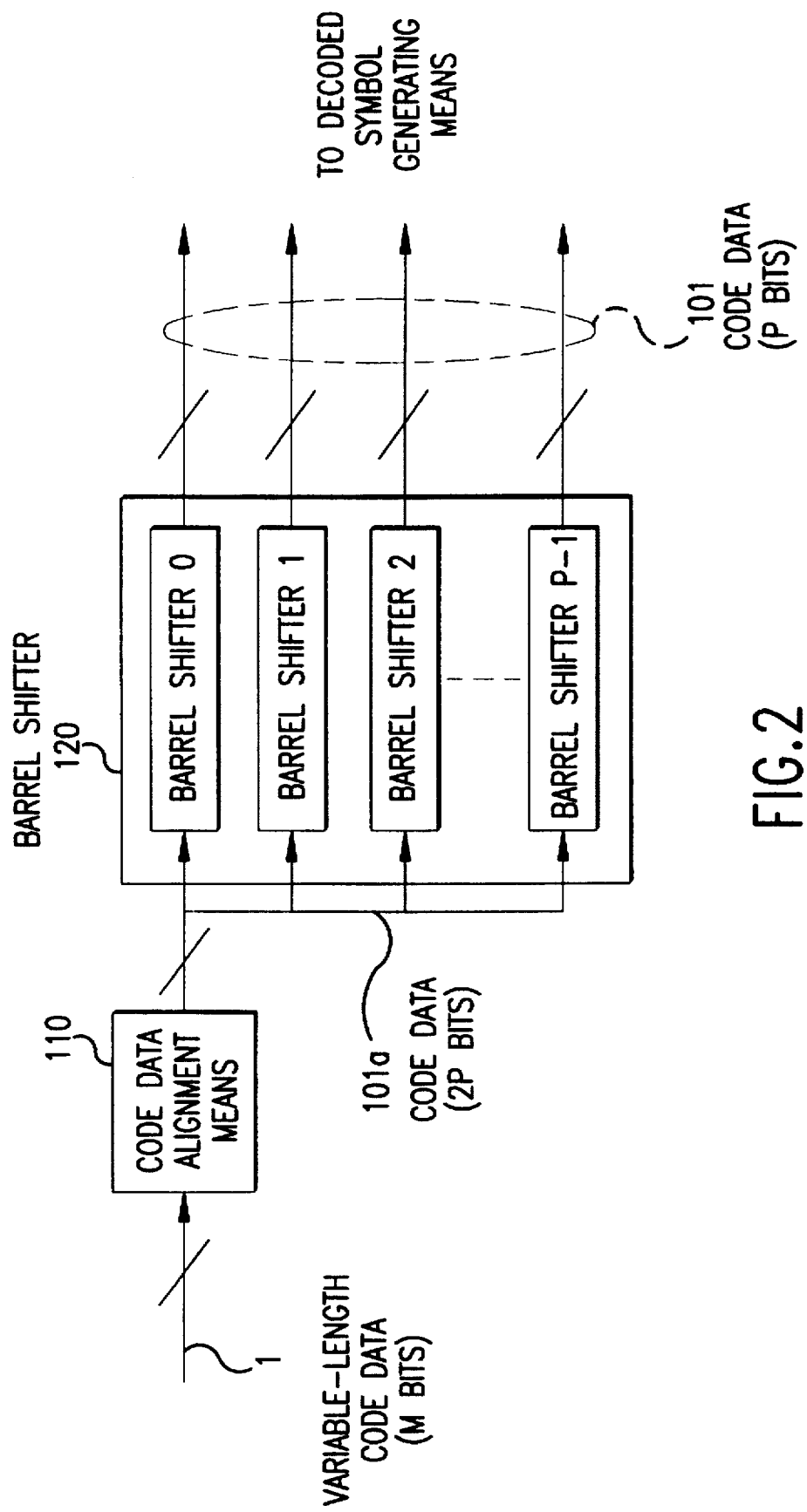
FIG. 2 is a block diagram showing a construction of code data generating means.

Next, the code data generating means is described in detail. FIG. 2 is a block diagram showing the code data generating means. The code data generating means 100 comprises code data alignment means 110 and barrel shifters 120.

The code data alignment means 110 receives the variable-length code data 1 (assumed to be m bits) as an input and outputs code data 101a having the bit number (2p bits) as twice as that of the maximum length codeword (assumed to be p bits).

The barrel shifter 120 consists of a barrel shifter 0, a barrel shifter 1, a barrel shifter 2, . . . . , and a barrel shifter p-1, the number of which is the bit number of the maximum length codeword (p). On receiving the code data 101a as the input, each barrel shifter carries out shift processing of the predetermined number of times, and then outputs the code data 101 in the number of the bit number of maximum length codeword. For example, the barrel shifter 0 carries out the shift processing of 0 bit, the barrel shifter 1 carries out the shift processing of 1 bit, the barrel shifter 2 carries out the shift processing of 2 bits, . . . . , and the barrel shifter p-1 carries out the shift processing of (p-1) bits, and then the code data 101 of each of upper p bits is carried out.

Figure 3:
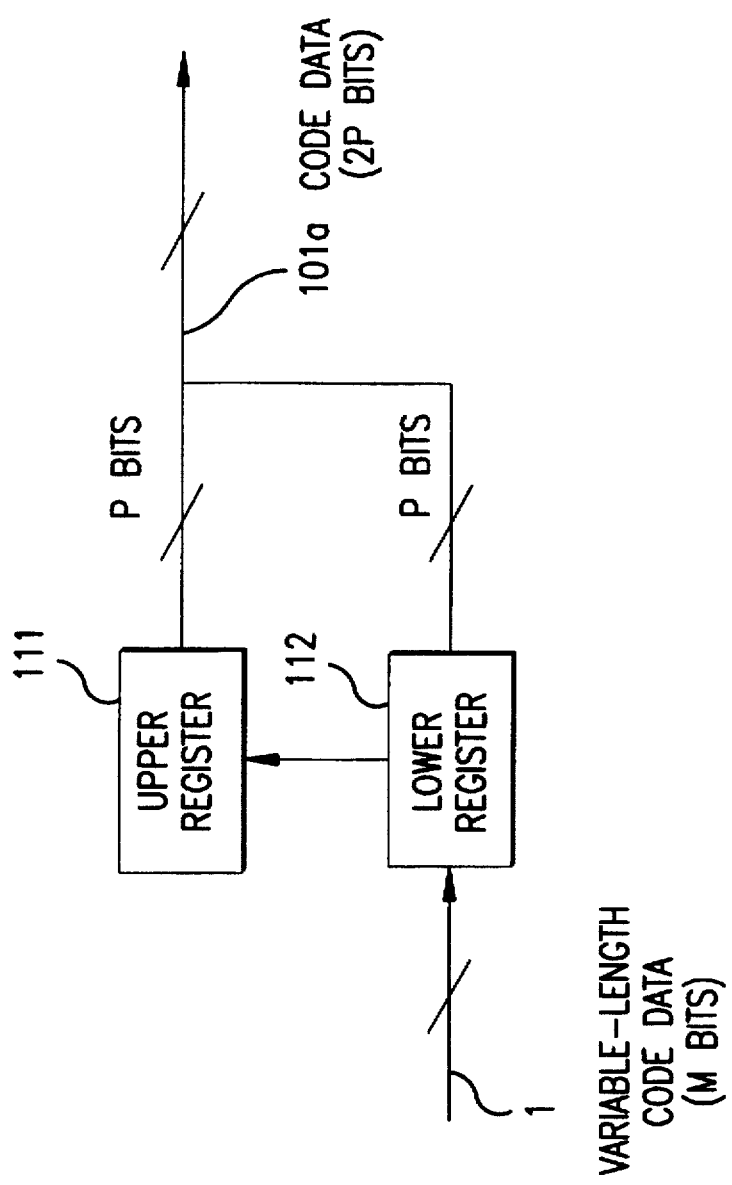
FIG. 3 is a block diagram showing a construction of code data alignment means.

FIG. 3 is an internal block diagram of the code data alignment means. The code data alignment means 110 consists of an upper register 111 constituting upper p bits in outputting the code data and a lower register 112 constituting lower p bits.

The upper register 111 has the bit number of the maximum length codeword (p bits), which constitutes upper p bits in outputting the code data 101a having the bit number as twice as that of the maximum length codeword (2p bits). As same as the upper register 111, the lower register 112 has the bit number of the maximum length codeword (p bits), which constitutes the lower p bits in outputting the code data 101a having the bit number as twice as that of the maximum length codeword (2p bits).

Next the operation of the code data alignment means 110 is described in detail. At first the variable-length code data 1 of m bits is inputted and held in the lower m bits in the lower register 112. If the next m bits of variable-length code data 1 is inputted, the code data having been already held in the lower register 112 is shifted to the left by m bits, thereby the new variable-length code data is held in the lower m bits in the lower register 112. The process is repeated until the lower register 112 is full.

When the lower register 112 is full, if the data is held in the upper register 111, the code data 101a of 2p bits is outputted wherein data in the upper register 111 is assumed to be upper p bits and the data in the lower register 112 is assumed to be lower p bits. Afterwards the contents of the lower register 112 is transferred to the upper register 111, and accordingly the lower register 112 becomes empty.

On the other hand, if no data is held in the upper register 111, the contents of the lower register 112 is transferred to the upper register 111, and then the lower register 112 is rendered empty. In the same way, the variable-length code data 1 of m bits is inputted and held in the lower m bits in the lower register 112, and these series of operations are repeated.

Figure 4:
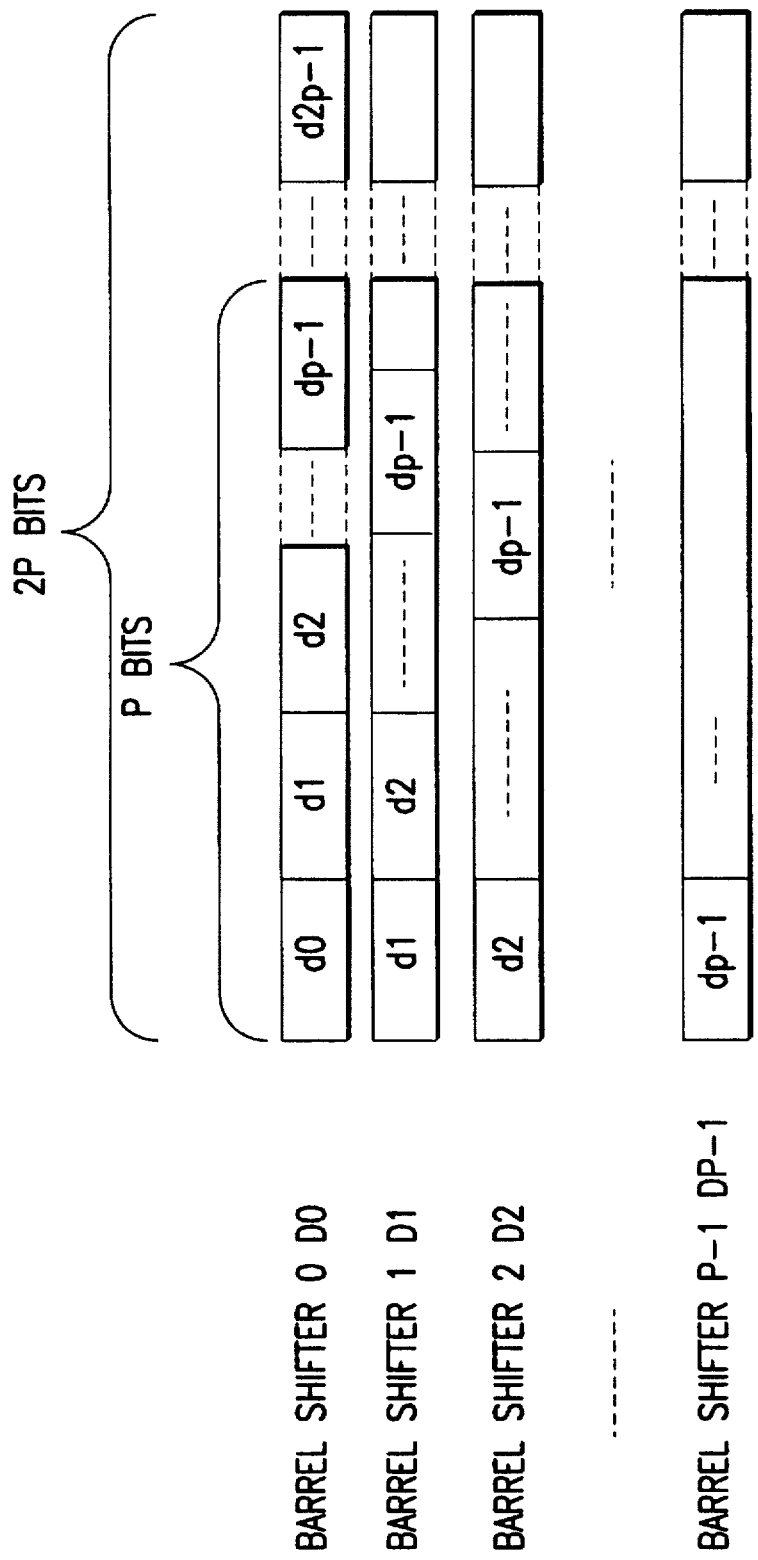
FIG. 4 illustrates operation of barrel shifters constituting the code data generation means.

The operation of the barrel shifter is now described in detail. FIG. 4 shows a shift processing executed in the barrel shifter. The data D0 of the barrel shifter 0 is a value outputted by the code data alignment means 110, which is a bit string of 2p bits comprising d0, d1, d2, . . . , and dp-1 in the direction from the most significant bit (MSB) to the least significant bit (LSB). The barrel shifter n is assumed to shift the code data D0 of the barrel shifter 0 to the left by n bits. That is, the barrel shifter 1 carries out the leftward shift of the code data D0 of the barrel shifter 0 by a single bit, and the barrel shifter 2 carries out the leftward shift of the code data D0 of the barrel shifter 0 by 2 bits.

Therefore, the code data D1 of the barrel shifter 1 is the bit string of 2p bits comprising d1, d2, . . . , and dp-1. Similarly, the code data Dp-1 of the barrel shifter p-1 is the bit string of 2p bits comprising dp-1, . . . .

That is, the code data to the number of p, which is the code data D0 of 2p bits plus the code data to the number of p-1 shifted bit by bit from the code data D0, is generated. The barrel shifter 0, barrel shifter 1, barrel shifter 2, . . . , and the barrel shifter p-1 output the upper p bits of the data D0, D1, D2, . . . , and Dp-1 of 2p bits, respectively.

Since the barrel shifters in number same as that of the bit number of the maximum length codeword are used, at least one variable-length code is included in the above-described p code data in number. The code data of 2p bits outputted by the code data alignment means 110 is that shifted to the left by p bits. Accordingly, data formed by the leftward shift by 1 bit of the code data Dp-1 of the barrel shifter p-1 is equal to the code data next outputted by the code data alignment means 110.

Figure 5:
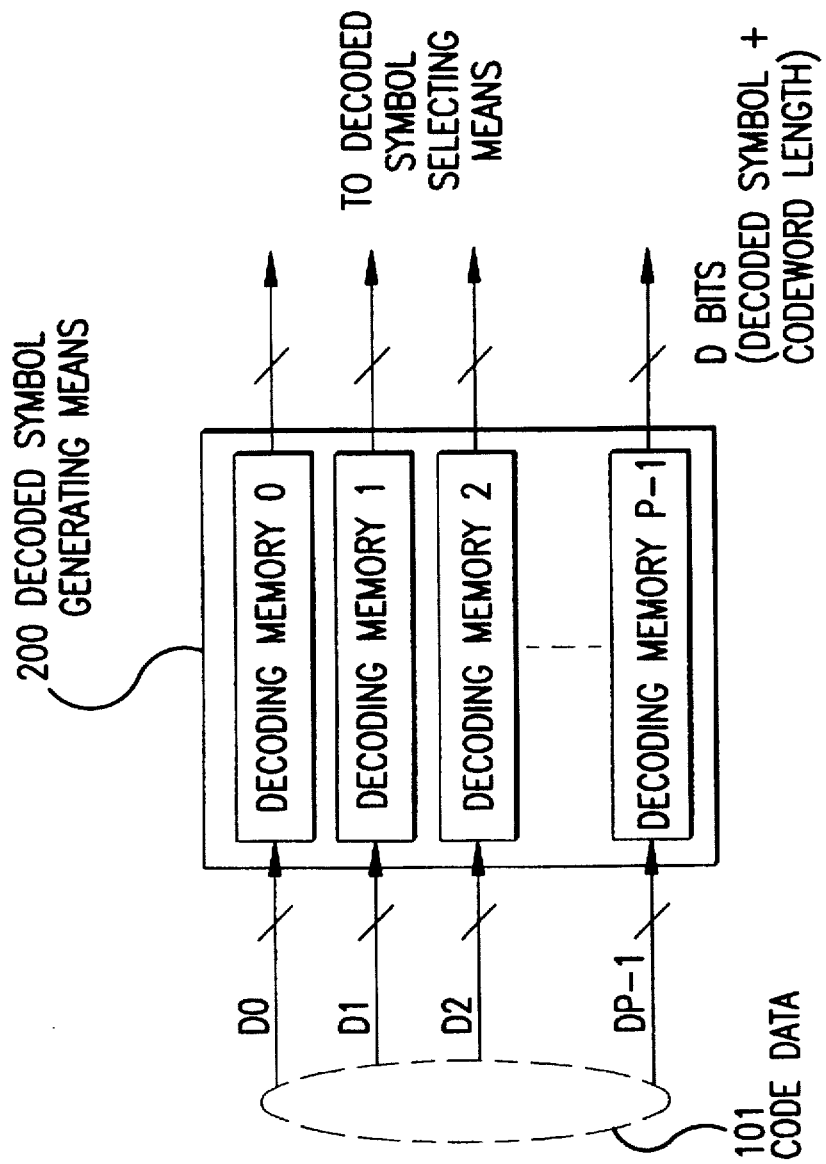
FIG. 5 is a block diagram showing a construction of decoded symbol generating means.

Next, the decoded symbol generating means is described in detail. FIG. 5 shows the construction of the decoded symbol generating means. The decoded symbol generating means 200 is constituted by the p decoding memories 0 to p-1 in number. The decoding memories 0 to p-1 receive the code data of p bits outputted by the code data generating means 100 as the input, and output the decoded symbol and codeword length corresponding thereto (in total, d bits).

The decoded symbol generating means 200 has the construction in which p decoding memories in number are arranged in parallel, which outputs the decoded symbol and the codeword length corresponding to each of p different code data D0 to Dp-1.

Figure 6:
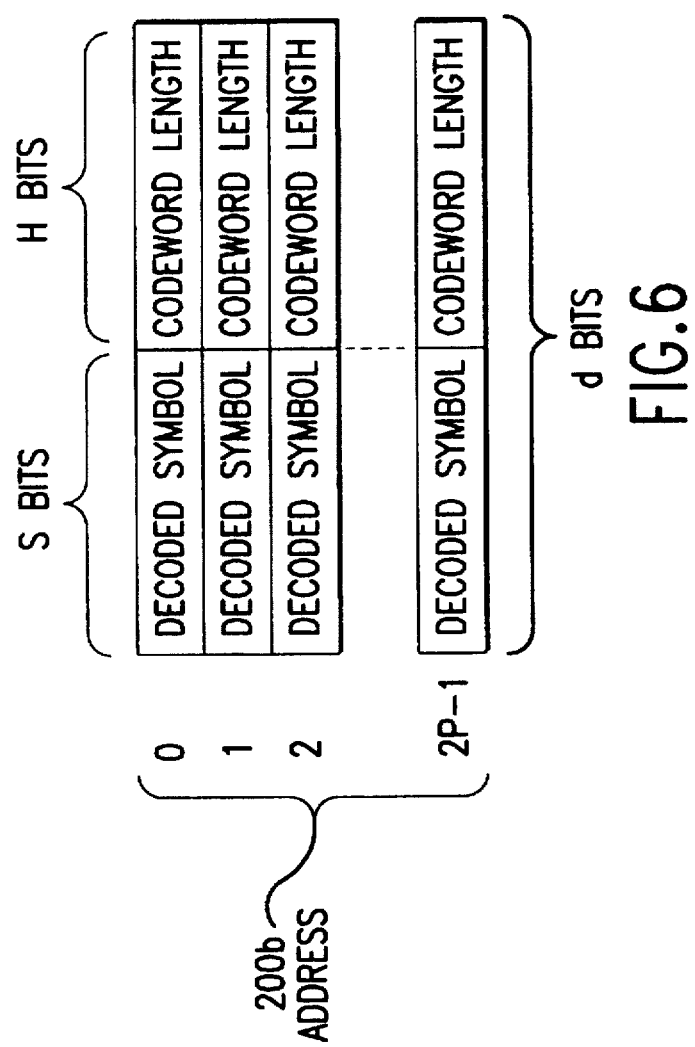
FIG. 6 is a block diagram showing a construction of a decoding memory in the decoded symbol generating means.

FIG. 6 shows a data structure stored in the decoding memory. The code data 101 of p bits represents an address 200b, and the outputted data is of d bits, upper s bits of which represent the decoded symbol and lower h bits of which represent the codeword length. Therefore, in this case, the memory capacity of the decoded symbol generating means 200 is $(2^p \times d)$ bits.

Figure 7:
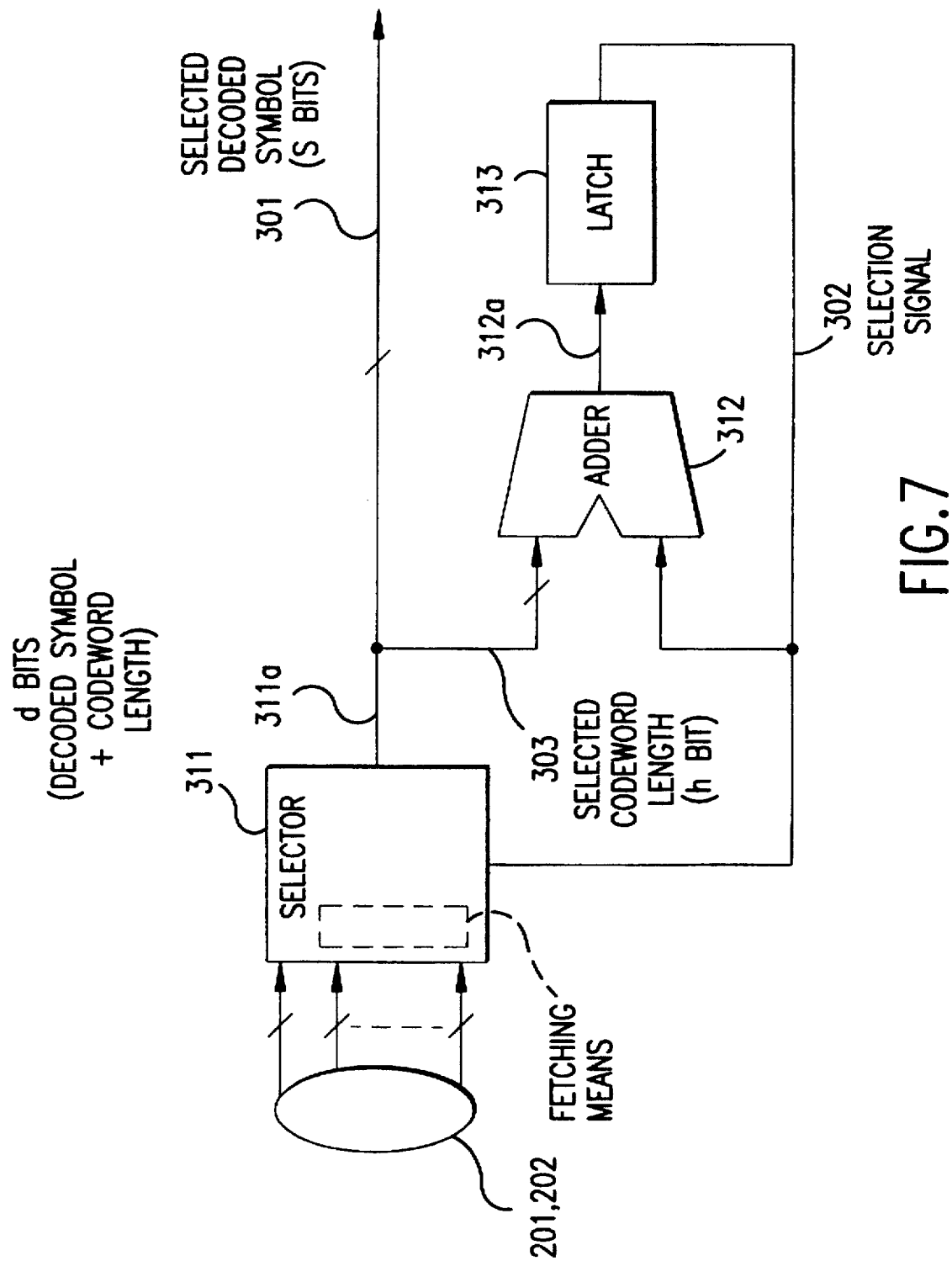
FIG. 7 is a block diagram showing a construction of the decoded symbol selecting means.

Next, the decoded symbol selecting means is described in detail. FIG. 7 is a block diagram of the decoded symbol selecting means. The decoded symbol selecting means 300 comprises a selector 311, an adder 312 and a latch 313. The selector 311 selects one desired decoded symbol and codeword length in accordance with the selection signal 302 from p pieces of data of d bits constituted by each of the decoded symbols 201 and the codeword lengths 202 outputted by the decoded symbol generating means 200. The selected signal 311a consists of the selected decoded symbol 301 (s bits) and the selected codeword length 303 (h bits), and the selected codeword length 303 (h bits) is inputted to the adder 312. The adder 312 makes an addition of the selected codeword length 303 and the selection signal 302. The latch 313 holds an output 312a of the adder 312, and outputs the selection signal 302 to the selector 311.

The decoded symbol selecting means 300 is explained in detail utilizing concrete numerals. It is assumed that the variable-length code data 1 is the data string comprising 3 bits, 6 bits, 15 bits, 14 bits, 2 bits, and so forth, and the decoded symbols corresponding thereto are a1, a2, a3, a4, a5, and so forth. Here the bit number of the maximum length codeword of the variable-length code data 1 is assumed to be 16 bits, and therefore the number of the barrel shifters constituting the variable-length code data generating means 100 is 16. That is, the number of the barrel shifters is 16: the barrel shifter 0 to the barrel shifter 15, and the selector 311 selects one selected decoded symbol 301 and selected codeword length 303 from 16 pieces of data each of which consists of the decoded symbol and the codeword length.

For example, if the selection signal 302 is 0, the decoded symbol and the codeword length corresponding to the code data outputted by the barrel shifter 0 are selected, if the selection signal 302 is 1, the decoded symbol and the codeword length corresponding to the code data outputted by the barrel shifter 1 are selected, . . . , and in the same way, if the selection signal 302 is 15, the decoded symbol and the codeword length corresponding to the code data outputted by the barrel shifter 15 are selected.

Figure 8:
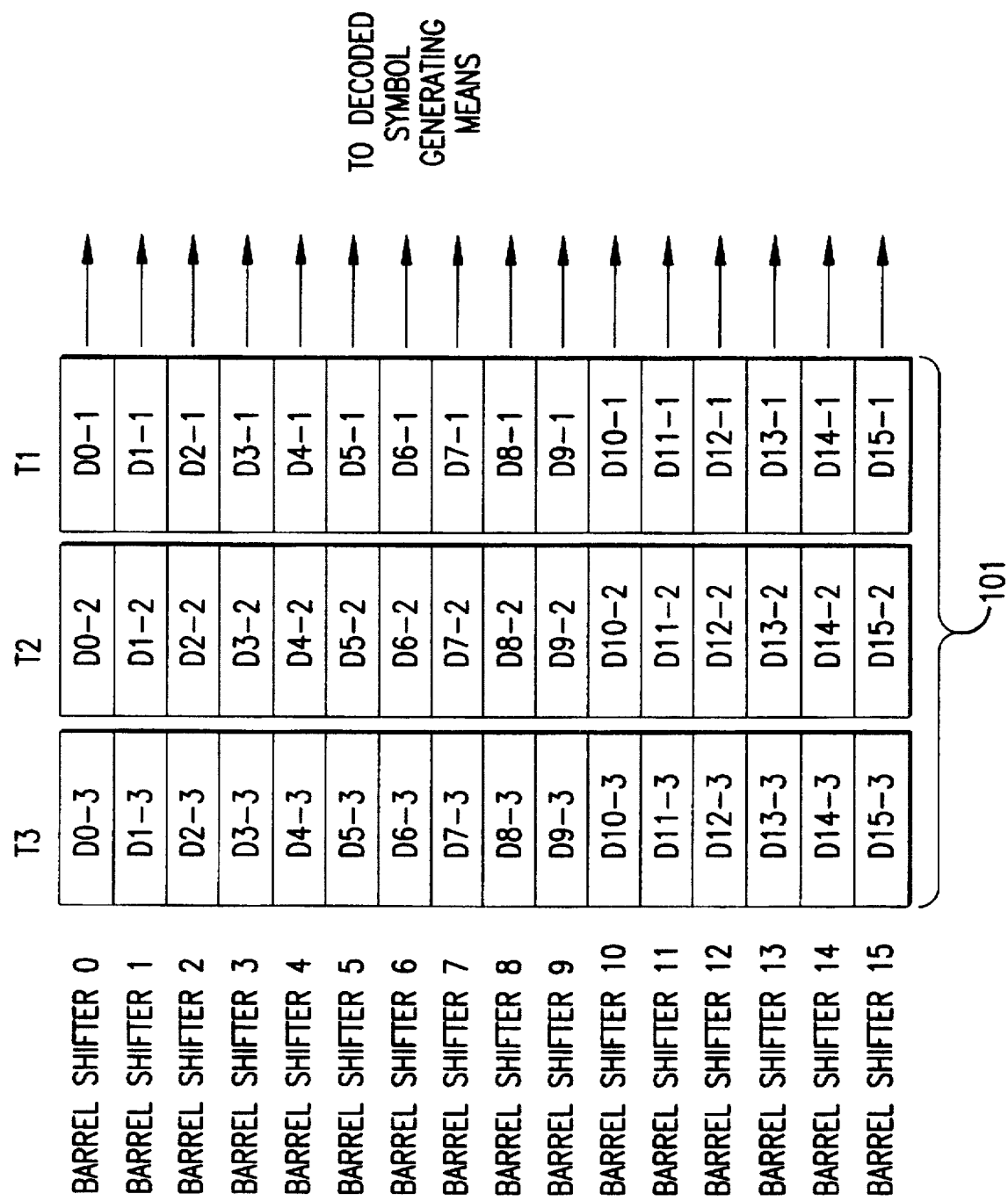
FIG. 8 shows a structure of code data outputted by the code data generating means.

FIG. 8 shows the code data 101 outputted by the code data generating means 100. T1, T2 and T3 represent cycles of executing the barrel shifting processes and the data Dx-y represents the output value of the barrel shifter x in the cycle Ty. For example, the data D2-1 represents the output value of the barrel shifter 2 in the cycle T1. As explained with reference to FIG. 4, the data Dx-y is obtained by shifting the data D0-y to the left by x bits in the cycle Ty, but D0-(y+1) is the data obtained by shifting the data D15-y to the left by a single bit. For example, D0-2 is obtained by shifting D15-1 to the left by a single bit, and D0-3 is obtained by shifting D15-2 to the left by a single bit.

That is, based on D0-1 as the standard, D0-2 is the data obtained by shifting D0-1 to the left by 16 bits and D0-3 is the data obtained by shifting D0-3 to the left by 32 bits.

Figure 9:
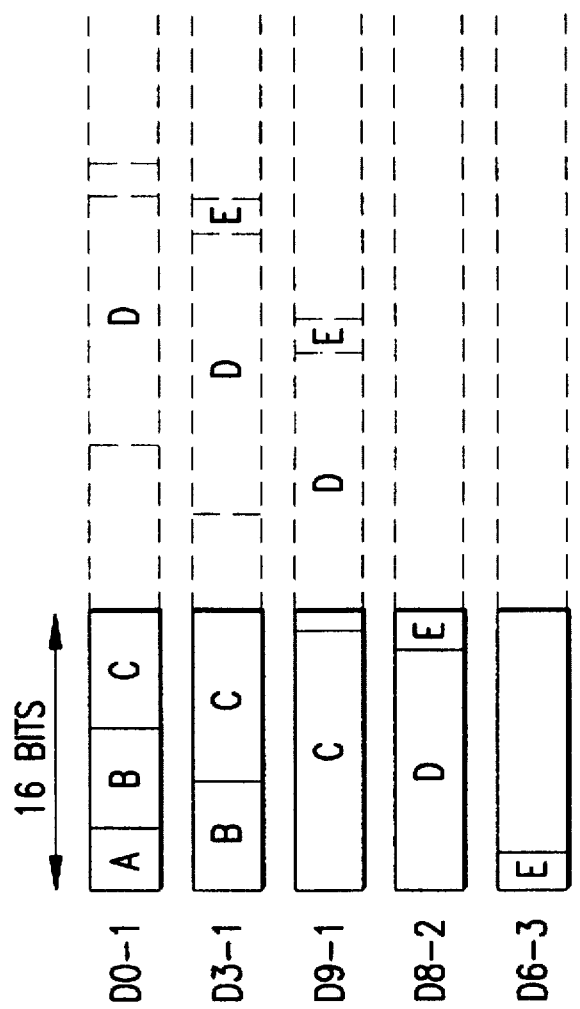
FIG. 9 shows the code data outputted by the code data generating means.

FIG. 9 shows an example of the variable-length code data. The variable-length code data of 3 bits, 6 bits, 15 bits, 14 bits, 2 bits and so forth are represented as A, B, C, D, E and so forth, respectively. D3-1 is obtained by shifting D0-1 to the left by 3 bits, D9-1 is obtained by shifting D0-1 to the left by 9 bits, D8-2 is obtained by shifting D0-2 to the left by 8 bits (or shifting D0-1 to the left by 24 bits), and D6-3 is obtained by shifting D0-3 to the left by 6 bits (or shifting D0-1 to the left by 38 bits). The starting bits of the variable-length code data B, C, D and E are the MSBs. In the figure, the variable-length code data are indicated by solid lines and dotted lines, and the portions indicated by the solid lines are the code data outputted to the decoded symbol generating means 200 (in this example, 16 bits). The decoded symbols corresponding to the variable-length code data A, B, C, D, E and so forth are assumed to be a1, a2, a3, a4, a5 and so forth, respectively.

Figure 10:
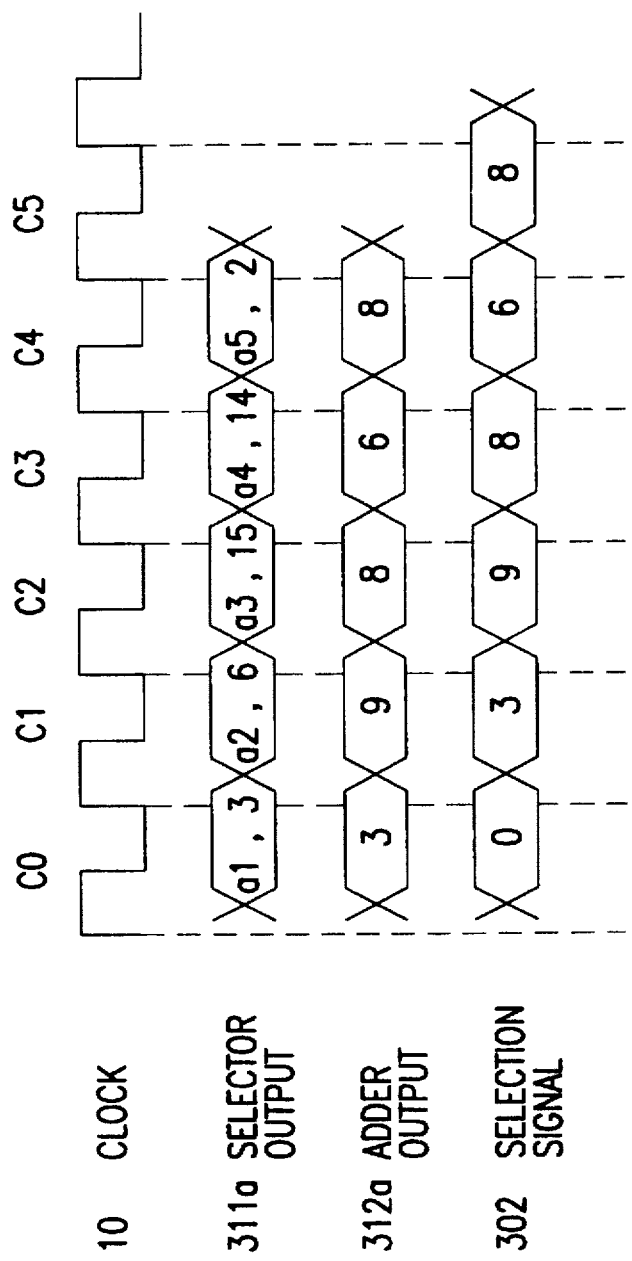
FIG. 10 is a timing chart for illustrating operation of the variable-length code decoder.

FIG. 10 shows a timing chart illustrating operation of the variable-length code decoder. A clock 10 is the system clock which operates the variable-length code decoder according to the present invention. The selector output 311a is constituted by the decoded symbols (a1, a2, a3, a4 and a5) and the codeword lengths (3, 6, 15, 14 and 2) outputted by the selector 311. The adder output 312a represents the result of addition carried out by the adder 312, and the selection signal 302 represents the signal outputted by the latch 313.

The variable-length code decoder is initialized before starting the decoding operation, whereby the selection signal 302 is set to 0. After completion of initialization, the variable-length code data 1 is inputted to the code data generating means 100, and the code data D0-1, D1-1, ..., D15-1 are outputted to the decoded symbol generating means 200.

[Cycle C0] The decoded symbol generating means 200 outputs the decoded symbols and the codeword lengths which are corresponding to the code data D0-1, D1-1, ..., D15-1 to the decoded symbol selecting means 300.

[Cycle C1] Since the selection signal 302 is 0, the selector 311 selects the decoded symbol (a1) and the codeword length (3) corresponding to the code data D0-1 from the 16 decoded symbols and codeword lengths. The value of the code length 3 is inputted to the adder 312 to be added to the value 0 of the selection signal 302 (3+0=3). The result of the addition is inputted to the latch 313 and 3 is outputted as the selection signal 302.

[Cycle C2] In the cycle C1, the selection signal 302 is 3, and accordingly, the selector 311 selects the decoded symbol (a2) and the codeword length (6) corresponding to the code data D3-1 from 16 pairs of the decoded symbol and the codeword length. In the same way, the value of the codeword length 6 is inputted to the adder 312, and added to the value 3 of the selection signal 3 (6+3=9). The result of the addition is inputted to the latch 313, and then 9 is outputted as the selection signal 302.

[Cycle C3] In the cycle C2 the selection signal 302 is 9, and accordingly, the selector 311 selects the decoded symbol (a3) and the codeword length (15) corresponding to the code data D9-1 from 16 pairs of the decoded symbol and codeword length. The value of the codeword length 15 is inputted to the adder 312 and added to the value 9 of the selection signal 302. In this case, because 15+9=24≧16, no decoded symbol and codeword length exist in those corresponding to the code data D0-1, D1-1, ..., and D15-1. The corresponding decoded symbol and codeword length are included in those corresponding to the code data D0-2, D1-2, ..., and D15-2. Therefore, the adder 312 outputs 24−16=8, namely, 8 is outputted by the latch 313 as the selection signal 302.

[Cycle C4] In the cycle C3, the selector 311 selects the decoded symbol (a4) and the codeword length (14) corresponding to D8-2 from the decoded symbols and codeword lengths corresponding to code data D0-2, D1-2, ..., D15-2. In accordance with the operation of the adder 312, 14+8= 22≧16, the adder 312 outputs 22−16=6. The latch 313 outputs 6 as the selection signal 302.

[Cycle C5] In the cycle C4, the code data to be objects are D0-3, D1-3, ..., and D15-3. In accordance with the value 6 of the selection signal 302, the decoded symbol (a5) and codeword length (2) corresponding to D6-3 are selected from the decoded symbols and codeword lengths corresponding to the code data D0-3, D1-3, ..., and D15-3. The value of the codeword length 2 is inputted to the adder 312 and added to the value 6 of the selection signal 302 (2+6=8). The result of the addition is inputted to the latch 313 and 8 is outputted as the selection signal 302. Thus the same processes are repeated.

Second Embodiment

Figure 11:
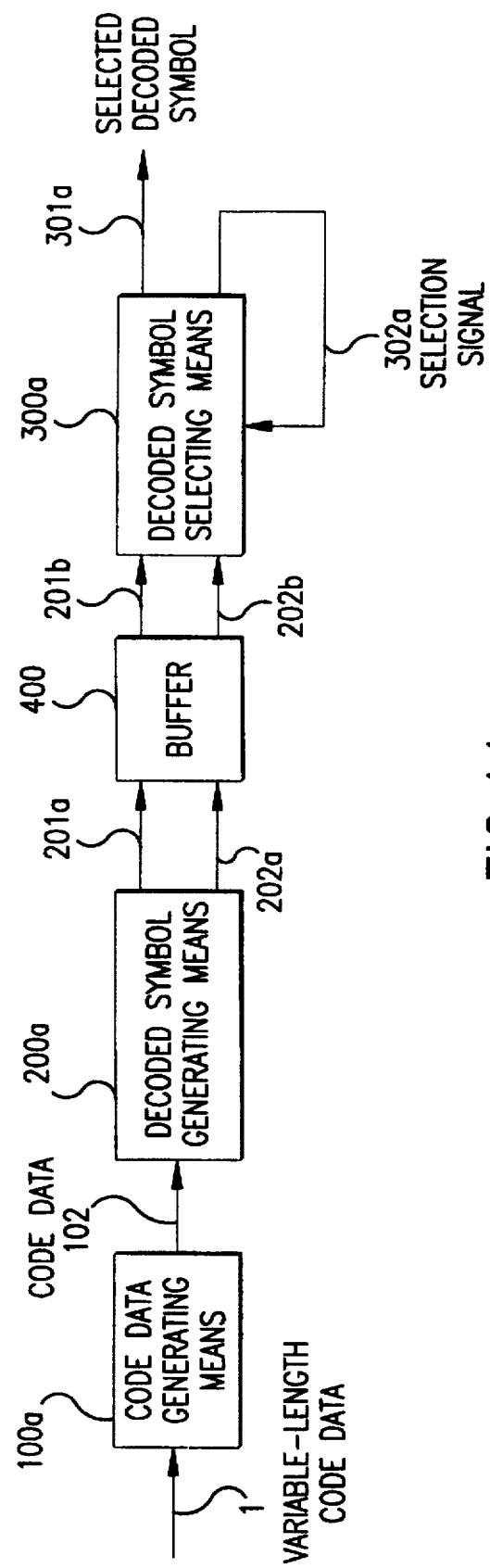
FIG. 11 shows a basic construction of a second embodiment of the variable-length code decoder according to the present invention.

A second embodiment of the variable-length code decoder according to the present invention is now explained. FIG. 11 shows a basic construction of the second embodiment of the variable-length code decoder comprising a code data generating means 100a, decoded symbol generating means 200a, a buffer 400 and decoded symbol selecting means 300a.

What is different from the construction of the first embodiment of the variable-length code decoder is that the buffer 400 is disposed between the decoded symbol generating means 200a and the decoded symbol selecting means 300a. The following is the reason for disposing the buffer 400. In the first embodiment, if the maximum length codeword is 16 bits, for example, the number of the barrel shifter to be set is 16 so that at least one desired code data exists in 16 code data in number obtained by a single barrel shifting process.

As described above, the Huffman code employs variable-length code which provides a shorter code to the signal of high frequency of occurrence and a longer code to the signal of low frequency of occurrence, which indicates high probability of existence of some code data to be used in 16 code data obtained by a single barrel shifting process. That is, the probability of repeated access of the decoded symbol selecting means 300a to the decoded symbols and codeword lengths corresponding to the 16 code data obtained by a single barrel shifting process is increased.

For example, in the first embodiment described with reference to FIGS. 8, 9 and 10, the decoded symbol selecting means 300a uses the result of the barrel shifting process carried out in the cycle T1 three times ((a1, 3), (a2, 6) and (a3, 15) in the cycles C0, C1 and C2, respectively). In other words, the decoded symbol selecting means 300 carries out processing in each and every cycle, and on the other hand, there are some cycles in which the barrel shifters of the code data generating means 100 do not carry out processing.

As described above, there is a difference in frequency of processing between the barrel shifting process carried out by the code data generating means 100 and the process carried out by the decoded symbol selecting means 300. To absorb the difference in frequency of processing, the buffer 400 is disposed between the decoded symbol generating means 200a and the decoded symbol selecting means 300a. Thereby it is possible to render the number of barrel shifters constituting the code data generating means 100a smaller than the bit number of maximum length codeword.

The second embodiment is described in more detail with concrete numerical values. It is assumed that the variable-length code data 1 is a data string of 3 bits, 6 bits, 15 bits, 14 bits, 2 bits and so forth, and the decoded symbols corresponding thereto are a1, a2, a3, a4, a5 and so forth, respectively. It is also assumed that the maximum length codeword of the variable-length code data is 16 bits. The number of barrel shifters constituting the code data generating means 100a is assumed to be the half of the bit number of the maximum length codeword, namely, 8. So, there are barrel shifters 0 to 7 in this case. The decoded symbol generating means 200a outputs the decoded symbol 201a and the codeword length 202a corresponding to the 8 code data 102 in number.

The decoded symbol 201b and the codeword length 202b after being outputted by the buffer 400 are inputted to the decoded symbol selecting means 300a, and a single desired selected decoded symbol 301a and codeword length are selected from 8 pairs of decoded symbols and codeword lengths.

Figure 12:
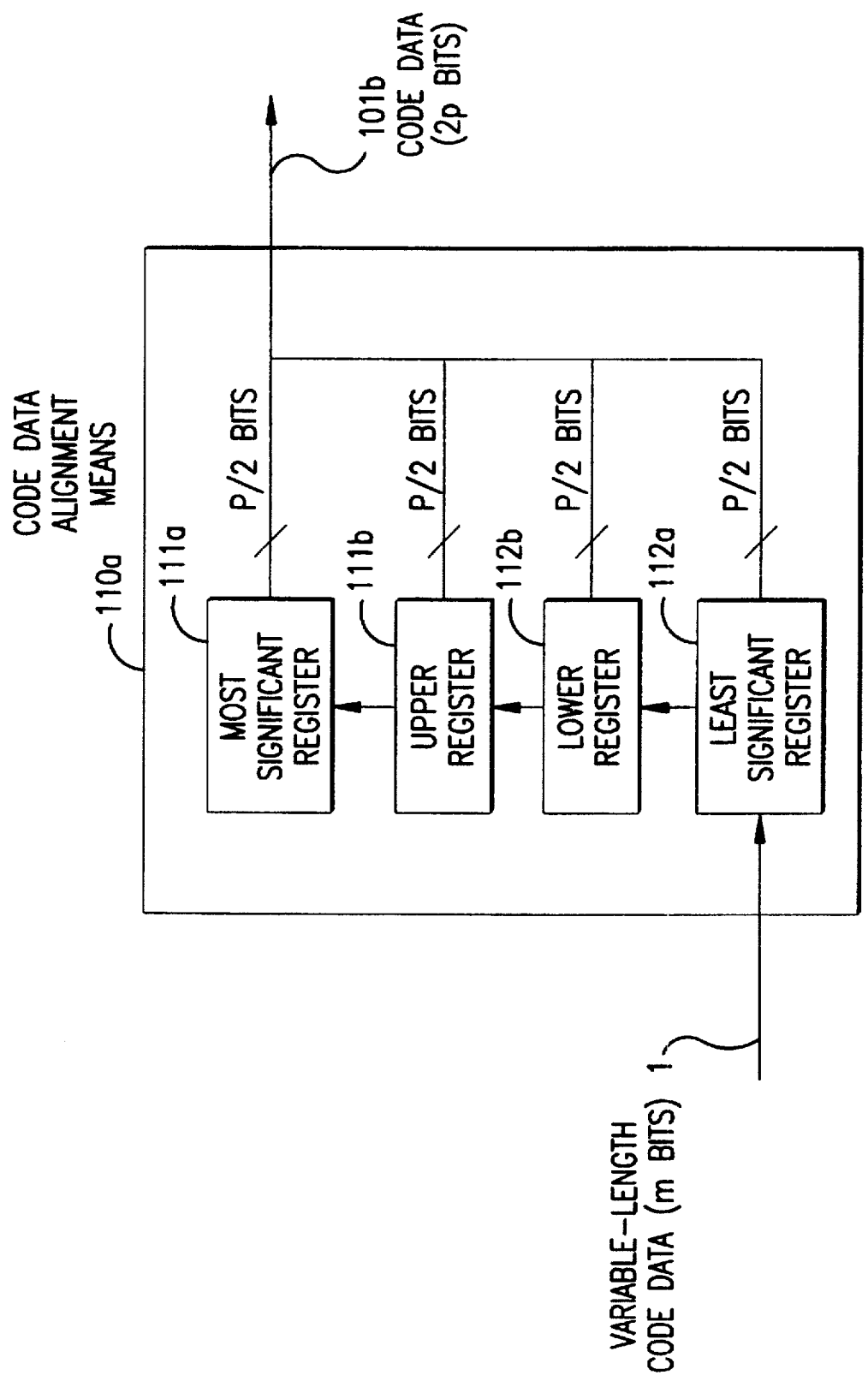
FIG. 12 is a block diagram showing a construction of code data generating means in the second embodiment of the variable-length code decoder.

FIG. 12 shows the construction of the code data alignment means 110a which outputs the code data shifted by half of the bit number of the maximum length codeword. The most significant register 111a, the upper register 111b, the lower register 112b and the least significant register 112a are the registers of the bit number half of that of the maximum length codeword (for example, p/2 bits, in this case 8 bits). In outputting the code data 101b of the bit number (2p bits) twice as that of the maximum length codeword, the most significant register 111a constitutes the most significant p/2 bits. That is, if it is assumed that the MSB is (2p−1) bits and the LSB is 0 bit, the most significant register 111a occupies bit positions from (2p−1) to 3p/2.

The upper register 111b occupies bit positions from (3p/2−1) to p as the upper p bits, and the lower register 112b occupies bit positions from (p−1) to p/2 as the lower p bits. The least significant register 112a occupies bit positions from (p/2−1) to 0 as the least significant p bits.

Next, the operation of the code data alignment means 11a is explained. At first, the variable-length code data 1 of m bits is inputted and held in the lower m bits of the least significant register 112a. When the next m bits variable-length code data 1 is inputted, the code data already held in the least significant register 112a is shifted to the left by m bits, and the new variable-length code data is held in the lower m bits of the least significant register 112a. The process is repeated until the least significant register 112a is full.

If the least significant register 112a becomes full and data is held in the most significant register 111a, the code data 101b of 2p bits is outputted, in which it is assumed that the data of the most significant register 111a is the most significant p/2 bits, the data of the upper register 111b is the upper p/2 bits, the data of the lower register 112b is the lower p/2 bits and the data of the least significant register 112a is the least significant p/2 bits. The contents of the least significant register 112a, the lower register 112b and the upper register 111b are transferred to the lower register 112b, the upper register 111b and the most significant register 111a, respectively, thus rendering the least significant register 112a empty.

If no data is held in the most significant register 111a, the contents of the least significant register 112a, lower register 112b and upper register 111b are shifted to the lower register 112b, upper register 111b and most significant register 111a, respectively, without outputting the 2p-bit code data 101b. Thereby the least significant register 112a is rendered empty.

In the same way, if m bits of variable-length code data 1 is again inputted, it is held in the lower m bits of the least significant register 112a, and the series of operations are subsequently repeated. With these code data generation mechanisms, the code data alignment means 11a outputs the code data 101b of 2p bits obtained by shifting the code data to the left by p/2 bits.

Figure 13:
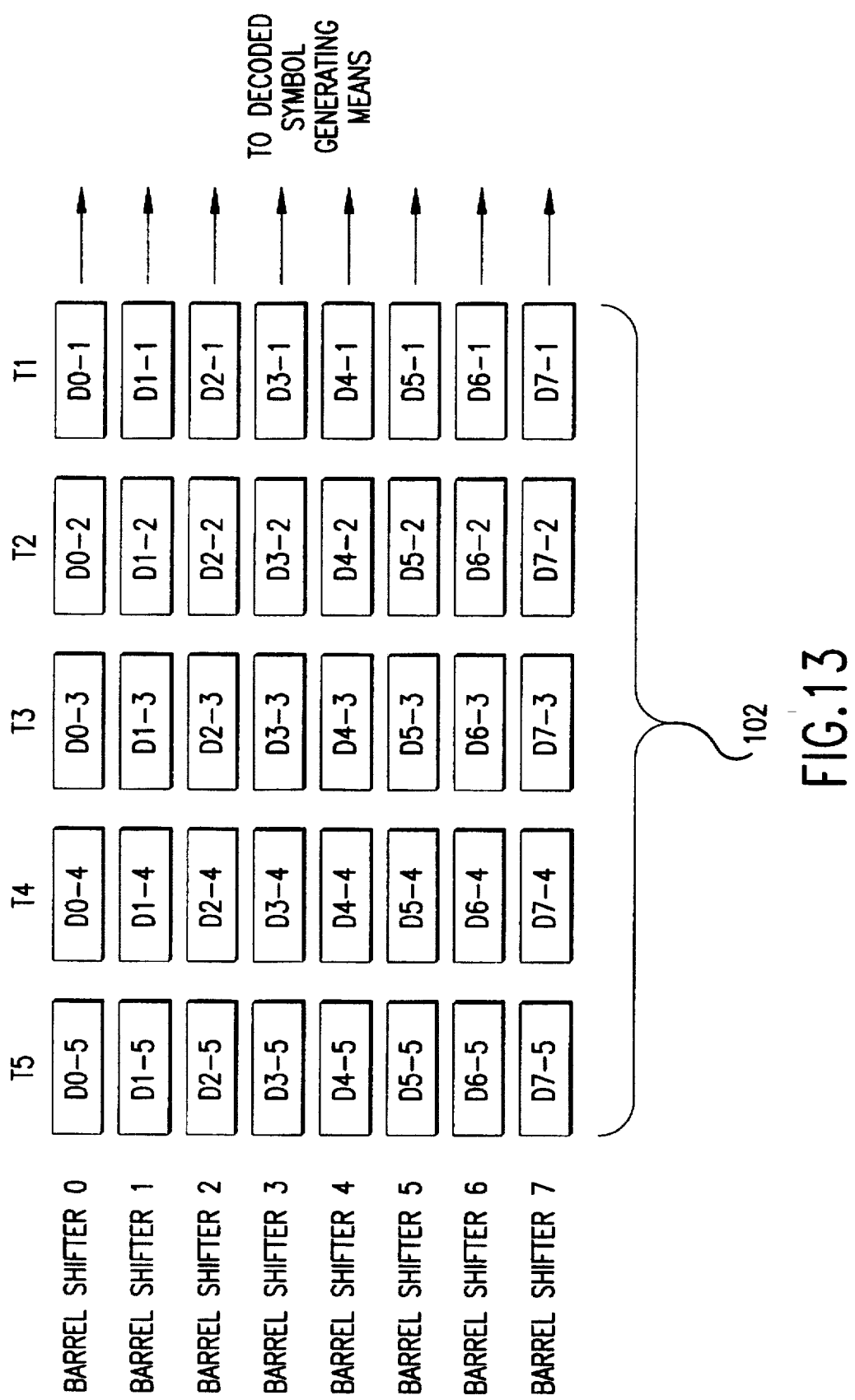
FIG. 13 shows data outputted by the code data generating means in the second embodiment of the variable-length code decoder.

FIG. 13 shows the data outputted by the code data generating means 100a. FIG. 13 employs the notation same as that of FIG. 8, and accordingly, explanation of the notation is omitted. The cycle in which the barrel shift processing is carried out is shown in the figure to the fifth cycle, namely, T1 to T5. Here, it is necessary that D0-2, D0-3, D0-4 and D0-5 are the data obtained by shifting D7-1, D7-2, D7-3 and D7-4, respectively, to the left by a single bit. Therefore, the code data alignment means 110a shall output the code data shifted by 8 bits.

Figure 14:
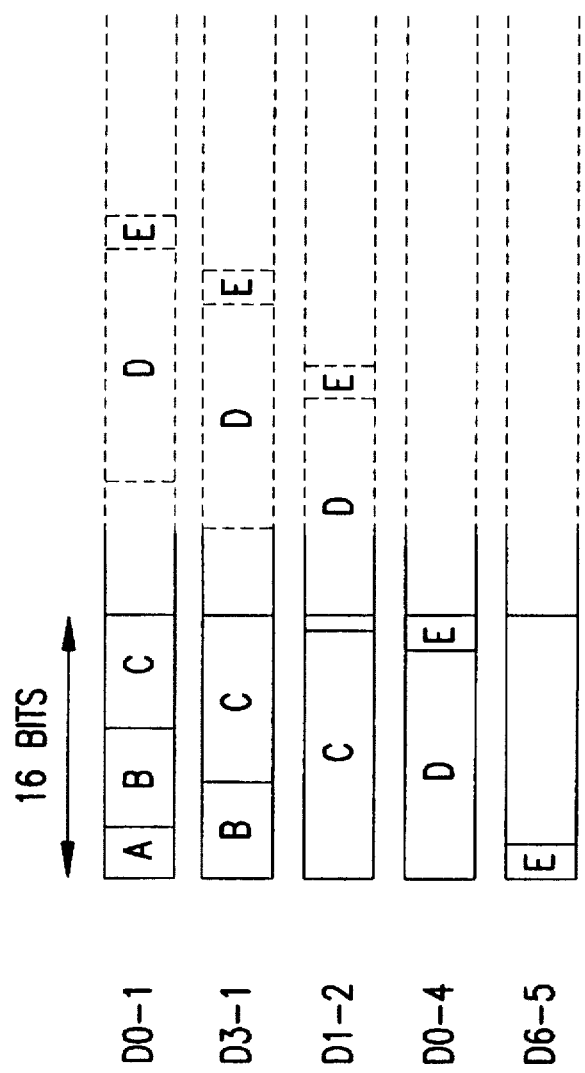
FIG. 14 shows a construction of variable-length code data outputted by the code data generating means in the second embodiment of the variable-length code decoder.

FIG. 14 shows an example of the variable-length code data. The variable-length code data of 3 bits, 6 bits, 15 bits, 14 bits, 2 bits and so forth are represented as A, B, C, D, E and so forth, respectively. D3-1, D1-2, D0-4, and D6-5 are the data obtained by shifting D0-1 to the left by 3 bits, D0-1 by 9 bits, D0-3 by 8 bits (D0-1 by 24 bits), and D0-5 by 6 bits (D0-1 by 38 bits) respectively. The starting bits of the variable-length code data 1 are the MSBs. In the figure, the variable-length code data are represented by the solid lines and dotted lines, and portions represented by the solid lines are the code data outputted by the decoded symbol generating means 200a (in this example, 16 bits). The decoded symbols corresponding to the variable-length code data A, B, C, D, E and so forth are assumed to be a1, a2, a3, a4, a5 and so forth, respectively.

Figure 15:
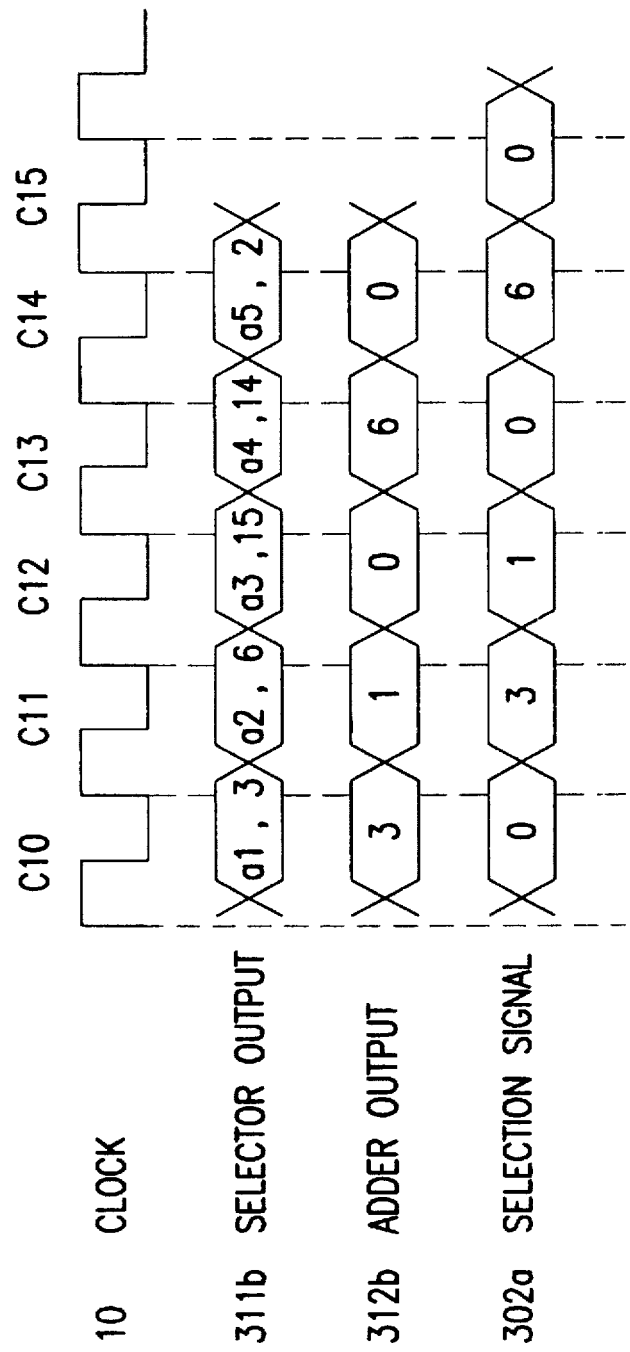
FIG. 15 is a timing chart illustrating operation of the second embodiment of the variable-length code decoder.

FIG. 15 shows a timing chart for illustrating operation of the variable-length code decoder. Before starting the decoding operation, the variable-length code decoder is initialized and the selection signal 302a is set to 0. After completion of initialization, the variable-length code data 1 is inputted to the code data generating means 100a and the code data D0-1, D1-1, . . . , and D7-1 are outputted to the decoded symbol generating means 200a. The decoded symbol generating means 200a writes the decoded symbols and the codeword lengths corresponding to the code data D0-1, D1-1, . . . , and D7-1 to the buffer 400. The operation is repeated as long as the buffer 400 has any empty space. That is, the decoded symbols and the codeword lengths corresponding to the respective code data D0-2, D1-2, . . . , D7-2, D0-3, D1-3, . . . , D7-3, D0-4, D1-4, . . . , D7-4, D0-5, D1-5, . . . , and D7-5, are written to the buffer 400.

[Cycle C10] After the data are stored in the buffer 400, the decoded symbols and codeword lengths corresponding to the code data D0-1, D1-1, . . . , D7-1 are read from the buffer 400 and inputted to the selector 311. Because the selection signal is 0, the selector 311 selects the decoded symbol (a1) and the codeword length (3) corresponding to the code data D0-1 from 8 pairs of the decoded symbols and codeword lengths.

[Cycle C11] The value of the codeword length 3 is inputted to the adder 312 to be added to the value 0 of the selection signal 302a (3+0=3). The result of addition is inputted to the latch 313 and 3 is outputted as the selection signal 302a.

[Cycle C12] In the cycle C11, since the value of the selection signal 302a is 3, the selector 311 selects the decoded symbol (a2) and the codeword length (6) corresponding to the code data D3-1 from 8 pairs of the decoded symbols and codeword lengths. As same as the cycle C11, value of the codeword length 6 is inputted to the adder 312 and added to the value 3 of the selection signal 302a In this case, 6+3=9≧8, which indicates that no corresponding decoded symbol and codeword length exist in the decoded symbols and the codeword lengths corresponding to the code data D0-1, D1-1, . . . , and D7-1.

The corresponding decoded symbol and codeword length exist in group of those corresponding to the code data D0-2, D1-2, . . . , D7-2; accordingly, the corresponding decoded symbol and codeword length are read from the buffer 400. The adder 312 outputs 9−8=1, and the latch 313 outputs the value 1 as the selection signal 302a[Cycle C13] In the cycle C12, since the selection signal 302a is 1, the selector 311 selects the decoded symbol (a3) and the codeword length (15) corresponding to D1-2 from the decoded symbols and codeword lengths. The value of the codeword length 15 is inputted to the adder 312 and added to the value 1 of the selection signal 302a. In this case, since 15+1=16≧8 and 15+1≧8×2, no corresponding decoded symbol and codeword length exist in those corresponding to the code data D0-2, D1-2, . . . , and D7-2.

The corresponding decoded symbol and codeword length exist in those corresponding to the code data D0-4, D1-4, . . . , and D7-4, and the corresponding decoded symbol and codeword length are read from the buffer 400. The adder 312 outputs 16−8−8=0 and the latch 313 outputs 0 as the selection signal 302a.

[Cycle C14] In the cycle C13, the selector 311 selects the decoded symbol (a4) and codeword length (14) corresponding to D0-4 from the decoded symbols and codeword lengths. The value of the codeword length 14 is inputted to the adder 312 and the operation in the adder 312 is 14+0= 14≧8. Accordingly, the adder 312 outputs 14−8=6, and the latch 313 outputs 6 as the selection signal 302a.

[Cycle C15] In the cycle C14, the decoded symbols and codeword lengths to be the objects are those corresponding to the code data D0-5, D1-5, . . . , and D7-5 and read from the buffer 400. The decoded symbol (a5) and the codeword length (2) corresponding to the code data D6-5 are selected in accordance with the value 6 of the selection signal 302a.

In the same way, since the codeword length is 2 and therefore 2+6=8≧8, the latch 313 outputs 8−8=0 as the selection signal 302a, which are repeated.

The buffer 400 is required to have at least the capacity for storing the decoded symbols and codeword lengths of the bit number equal to that of the maximum length codeword. In the above-described example, at least (16×d) bits are necessary because the maximum length codeword is 16 bits. The number of barrel shifters depends on the frequency of occurrence of the variable-length codeword. Therefore, if the number of barrel shifters is determined depending on the frequency of occurrence of the variable-length code, the barrel shifting process is efficiently carried out with the minimum essential number of barrel shifters.

For example, assuming the average code length (total capacity of the variable-length codeword/the number of cycles required for processing) to be a criterion, an integral number close thereto may be determined to be the number of barrel shifters. Therefore, if the average code length is 7.8 bits, the decoding process is executed by 7.8 bits in every cycle; accordingly, the number of barrel shifters can be appropriately determined to be 6, 7 or 8.

As described above, the variable-length code decoder according to the present invention has the construction in which no loop is formed between the barrel shifting process carried out by the code data generating means and codeword length generating process carried out by the decoded symbol generating means, whereby it is possible to decode one or more codewords in every cycle despite the high operation frequency.

By disposing a buffer as shown in the second embodiment, the number of barrel shifters constituting the code data generating means and the number of decoding memories constituting the decoded symbol generating means can be reduced while realizing execution of one decoding process of one or more codewords in one cycle, which results in reduction of the hardware amount.

The foregoing description of preferred embodiments of this invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A variable-length code decoder which decodes variable-length code data consisting of variable-length codewords, comprising:

plural barrel shifters each of which executes shift processing on inputted variable-length code data bit by bit from 0 bit to (the bit number of a maximum length codeword −1), said barrel shifters being in number equal to said bit number of said maximum length codeword and arranged in parallel connection;

plural storing means being in number equal to that of said barrel shifters, each of which stores a pair of a decoded symbol and codeword length thereof corresponding to code data;

fetching means being in number equal to that of said barrel shifters, each of which fetches said pair of said decoded symbol and said codeword length thereof stored in corresponding one of said storing means in accordance with said code data outputted from each of said barrel shifters, each of said fetching means being connected to corresponding one of said barrel shifters and further connected to corresponding one of said storing means; and selecting means for selecting a predetermined pair from plural pairs of said decoded symbol and said codeword length thereof fetched by said plural fetching means in an initial decoding process, and selecting any one pair from said plural pairs of said decoded symbol and said codeword length thereof fetched by said plural fetching means utilizing said codeword length selected in said initial decoding process in decoding processes subsequent thereto.

2. The variable-length code decoder according to claim 1, wherein a bit length of each of said barrel shifters is at least twice as that of said maximum length codeword.

3. A variable-length code decoder which decodes variable-length code data consisting of variable-length codewords, comprising:

plural barrel shifters each of which executes shift processing on inputted variable-length code data a predetermined number of times and outputs code data consisting of the bit number of a maximum length codeword, said barrel shifters being in number less than said bit number of said maximum length codeword;

plural storing means being in number equal to that of said barrel shifters, each of which stores a pair of a decoded symbol and codeword length thereof corresponding to code data;

fetching means being in number equal to that of said barrel shifters, each of which fetches said pair of said decoded symbol and said codeword length thereof stored in corresponding one of said storing means in accordance with said code data outputted from each of said barrel shifters;

a buffer for storing said plural pairs of said decoded symbol and said codeword length thereof fetched by said plural fetching means; and selecting means for selecting a predetermined pair from plural pairs of said decoded symbol and said codeword length thereof stored in said buffer in an initial decoding process, and selecting any one pair from said plural pairs of said decoded symbol and said codeword length thereof stored in said buffer utilizing said codeword length selected in said initial decoding process in decoding processes subsequent thereto.

4. The variable-length code decoder according to claim 3, wherein a bit length of each of said barrel shifters is at least twice as that of said maximum length codeword.

5. The variable-length code decoder according to claim 3, wherein said buffer has a capacity of storing said pairs of said decoded symbol and said codeword length thereof at least in number of said bit number of said maximum length codeword.

6. The variable-length code decoder according to claim 3, wherein the number of said barrel shifters is equal to an integral value of quotient discarding a part less than a decimal point in dividing a total bit number of said codeword by the number of cycles required for processing.

7. The variable-length code decoder according to claim 3, wherein the number of said barrel shifters is equal to an integral value of quotient raising a part less than a decimal point to a unit in dividing a total bit number of said codeword by the number of cycles required for processing.

* * * * *